(12) United States Patent
Wada

(10) Patent No.: US 8,410,467 B2
(45) Date of Patent: Apr. 2, 2013

(54) NONVOLATILE MEMORY DEVICE AND METHOD OF MANUFACTURING THE SAME

(75) Inventor: Junichi Wada, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 233 days.

(21) Appl. No.: 12/813,664

(22) Filed: Jun. 11, 2010

(65) Prior Publication Data

US 2011/0037043 A1 Feb. 17, 2011

(30) Foreign Application Priority Data

Aug. 12, 2009 (JP) ................... 2009-187347

(51) Int. Cl.
*H01L 29/02* (2006.01)

(52) U.S. Cl. .. 257/2; 257/3; 257/4; 257/5; 257/E29.002; 438/102; 438/103; 438/104

(58) Field of Classification Search .................. 257/2–5, 257/E29.02; 438/102
See application file for complete search history.

(56) References Cited

U.S. PATENT DOCUMENTS

2009/0034123 A1 2/2009 Aoki et al.
2009/0250678 A1* 10/2009 Osano et al. .................. 257/2

FOREIGN PATENT DOCUMENTS

| JP | 2007-335471 | 12/2007 |
|---|---|---|
| JP | 2008-91748 | 4/2008 |
| JP | 2008-205007 | 9/2008 |
| JP | 2008-227267 | 9/2008 |
| JP | 2008-276905 | 11/2008 |
| JP | 2009-71206 | 4/2009 |
| JP | 2009-157982 | 7/2009 |

* cited by examiner

*Primary Examiner* — Jami M Valentine

(74) *Attorney, Agent, or Firm* — Finnegan, Henderson, Farabow, Garrett & Dunner, L.L.P.

(57) ABSTRACT

According to one embodiment, a nonvolatile memory device includes a first wire, a second wire and a nonvolatile memory cell. The first wire is formed to extend in a first direction, and the second wire is formed at height different from height of the first wire and to extend in a second direction. The nonvolatile memory cell is arranged to be held between the first wire and the second wire in a poison where the first wire and the second wire cross. The nonvolatile memory cell includes a nonvolatile storage layer and a current limiting resistance layer connected in series to the nonvolatile storage layer and having resistance of 1 kilo-ohm to 1 mega-ohm.

9 Claims, 13 Drawing Sheets

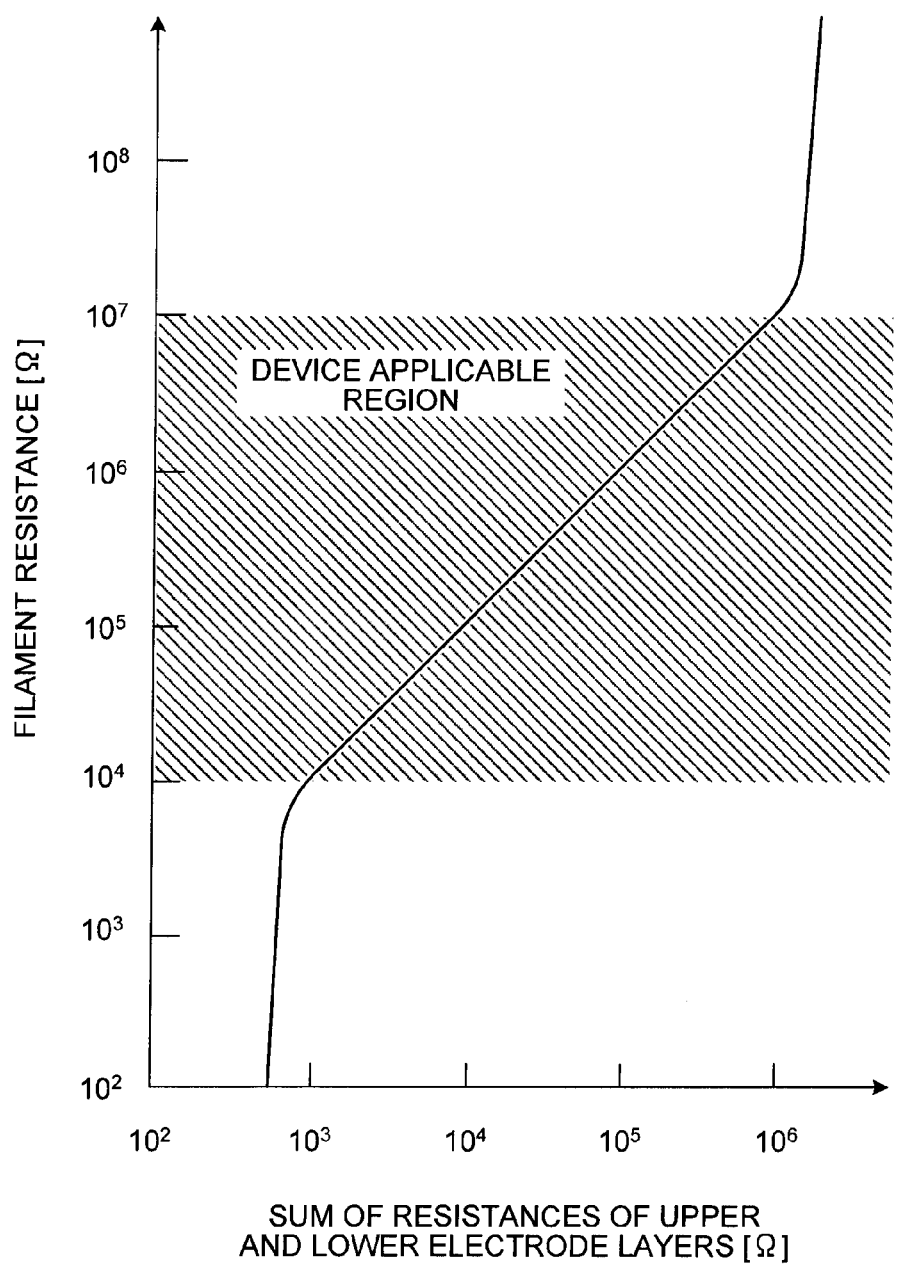

US 8,410,467 B2

NONVOLATILE MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2009-187347, filed on Aug. 12, 2009; the entire contents of which are incorporated herein by reference.

BACKGROUND

1. Field

Embodiments described herein relate generally to a nonvolatile memory device.

2. Description of the Related Art

A resistive random access memory (ReRAM) attracts attention as a nonvolatile memory device of the next generation because the resistive random access memory is hardly affected by downsizing and the capacity thereof can be increased. The resistive random access memory stores, in a nonvolatile manner, resistance information of an electrically-rewritable variable resistance element, for example, a high resistance state and a low resistance state. In such a resistive random access memory, for example, variable resistance memory cells are arranged in an array shape in crossing positions of a plurality of bit lines extending in parallel to one another in a first direction and a plurality of word lines extending in parallel to one another in a second direction perpendicular to the first direction. In each of the variable resistance memory cells, a storage layer in the variable resistance element, electrode layers of platinum (Pt), titanium nitride (TiN), or the like provided on and under the storage layer, and a rectifying element such as a Schottky diode, a PN junction diode, or a PIN diode are connected in series (see, for example, Japanese Patent Application Laid-Open No. 2009-157982).

Examples of a material of the storage layer include metal oxides such as NiO, $V_2O_5$, ZnO, $Nb_2O_5$, $TiO_2$, $WO_3$, CoO, $ZrO_2$, and $HfO_2$, a high resistance state and a low resistance state of which can be switched according to the control of a voltage value and an application time. Usually, the variable resistance element has high resistance in an initial state. Therefore, first, processing called forming for feeding, while adjusting voltage, electric current and forming a filament (a current path) in nanometer order in the variable resistance element to reduce the resistance is performed. Thereafter, reset processing for applying voltage to the variable resistance element having the reduced resistance to feed electric current and increase the resistance and set processing for applying voltage to the variable resistance element having the high resistance to feed electric current and reduce the resistance are performed to create two states of high resistance and low resistance. Resistance information is stored in the variable resistance element to cause the variable resistance element to function as a memory (see, for example, Japanese Patent Application Laid-Open No. 2008-227267).

However, during the forming or the set, when voltage is applied to the variable resistance element, resistance suddenly falls at certain voltage. Therefore, it is likely that large electric current flows to the variable resistance element and breaks the variable resistance element. When the resistance of the variable resistance element set during the set is too low, large reset current flows to the variable resistance element during the reset. A driving circuit element and a protection circuit element are broken by the current.

BRIEF DESCRIPTION OF THE DRAWINGS

FIG. 8 is a schematic graph of a relation between the resistance of a variable resistance layer and the resistance of electrode layers;

DETAILED DESCRIPTION

In general, according to one embodiment, a nonvolatile memory device includes a first wire, a second wire and a nonvolatile memory cell. The first wire is formed to extend in a first direction, and the second wire is formed at height different from height of the first wire and to extend in a second direction. The nonvolatile memory cell is arranged to be held between the first wire and the second wire in a poison where the first wire and the second wire cross. The nonvolatile memory cell includes a nonvolatile storage layer and a current limiting resistance layer connected in series to the nonvolatile storage layer and having resistance of 1 kilo-ohm to 1 mega-ohm.

Exemplary embodiments are explained in detail below with reference to the accompanying drawings. The present invention is not limited by the embodiments. Sectional views of a nonvolatile memory device referred to in the embodiments are schematic. A relation between the thickness and the width of a layer, a ratio of the thicknesses of layers, and the like are different from actual ones. Film thicknesses explained below are examples. Film thicknesses in the present invention are not limited to these film thicknesses.

Figure 1:
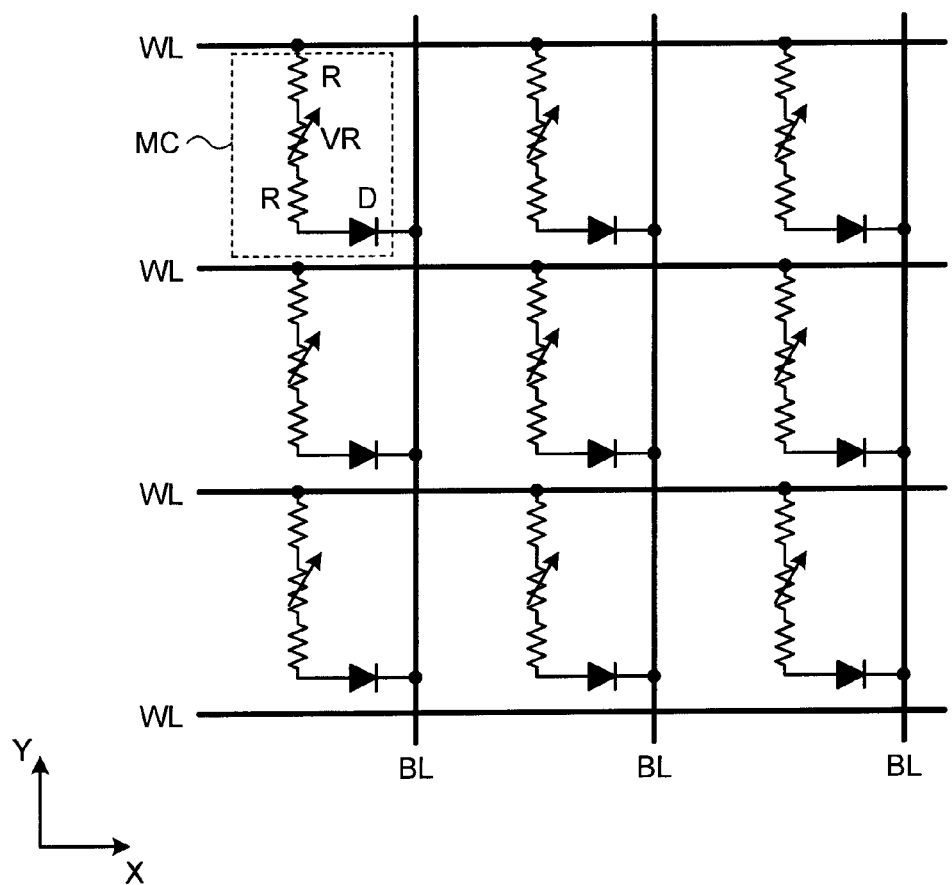
FIG. 1 is an equivalent circuit diagram of an example of a memory cell array configuration of a nonvolatile memory device according to a first embodiment.

FIG. 1 is an equivalent circuit diagram of an example of a memory cell array configuration of a nonvolatile memory device according to a first embodiment. In the figure, a left to right direction in the paper surface is represented as X direction and a direction perpendicular to the X direction in the paper surface is represented as Y direction. A plurality of word lines WL extending in parallel to one another in the X direction (a row direction) and a plurality of bit lines BL extending in parallel to one another in the Y direction (a column direction) at height different from the height of the word lines WL are arrayed to cross each other. A variable resistance memory cell (hereinafter also simply referred to as "memory cell") MC in which a variable resistance element VR as a nonvolatile storage element and a rectifying element D are connected in series is arranged in each of crossing sections of the word lines WL and the bit lines BL. In the variable resistance element VR, current limiting resistance elements R having resistance lower than that of the variable resistance element VR and higher than that of a normal wire are connected in series across the variable resistance element VR. In this example, one end of the variable resistance element VR is connected to the word line WL via the current limiting resistance element R and the other end thereof is connected to the bit line BL via the current limiting resistance element R and the rectifying element D.

Figure 2:
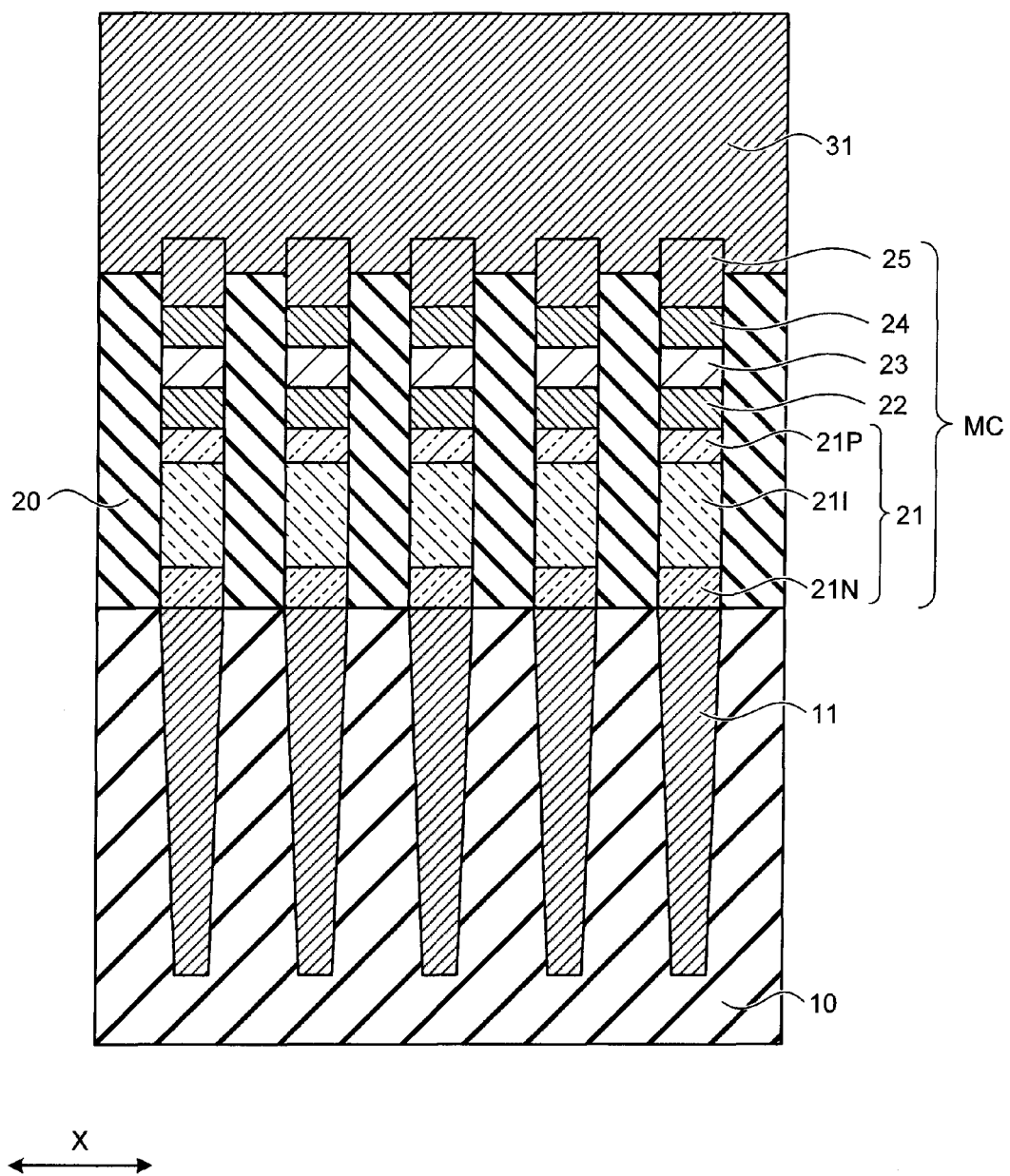
FIG. 2 is a schematic sectional view of an example of the structure of the nonvolatile memory device according to the first embodiment.

FIG. 2 is a schematic sectional view of an example of the structure of the nonvolatile memory device according to the first embodiment. In this figure, for example, a state of a part of a section on the word line WL along the X direction shown in FIG. 1 is shown. In the following explanation, the bit line BL corresponds to a first wire 11 and the word line WL corresponds to a second wire 31. A plurality of the first wires 11 (the bit lines BL) extending in the Y direction are formed in parallel to each other at predetermined intervals in a first interlayer insulating film 10. The second wire 31 (the word line WL) extending in the X direction orthogonal to the first wires 11 is formed in a not-shown third interlayer insulating layer formed on the first interlayer insulating film 10 via a second interlayer insulting film 20. In a region where each of the first wires 11 and the second wire 31 cross in the second interlayer insulating film 20, a memory cell MC is formed to be held between the wires. In the memory cell MC, a rectifying layer 21 as the rectifying element D, a first resistive layer 22 as the current limiting resistance element R, a variable resistance layer 23 as a nonvolatile storage layer in the variable resistance element VR, a second resistive layer 24 as the current limiting resistance element R, and a cap film 25 are stacked in order.

The rectifying layer 21 is formed of a material having a rectifying action such as a Schottky diode, a PN junction diode, or a PIN diode and formed on the first wire 11. In this example, the rectifying layer 21 includes a silicon layer having a PIN structure in which an N-type polysilicon film 21N having thickness of about 20 nanometers, an I-type polysilicon film 21I having thickness of about 110 nanometers, and a P-type polysilicon film 21P having thickness of about 20 nanometers are stacked in order from the first wire 11 side.

The variable resistance layer 23 is formed of a thin film of a metal oxide, a high resistance state and a low resistance state of which can be switched according to the control of a voltage value and an application time. Examples of the variable resistance layer 23 include a metal oxide film containing at least one kind of elements such as Si, Ti, Ta, Nb, Hf, Zr, W, Al, Ni, Co, Mn, Fe, Cu, and Mo. An oxygen deficiency is introduced into the metal oxide. A filament as an electric conduction path is locally formed in the metal oxide. To facilitate reset operation, it is desirable to set a filament volume small. Therefore, it is desirable to form the variable resistance layer 23 as a thin film having thickness equal to or smaller than 5 nanometers.

The first and second resistive layers 22 and 24 are formed of a conductive film having predetermined resistance to limit electric current flowing to the variable resistance layer 23 during forming and during set to prevent a filament size from becoming too large, and during reset to prevent large reset current from flowing. The resistance of one of the first and second resistive layers 22 and 24 or a sum of the resistances of the first and second resistive layers 22 and 24 is adjusted to be equal to or larger than 1 kilo-ohm and equal to or smaller than 1 mega-ohm. The thickness of the first and second resistive layers 22 and 24 is set to thickness of about 5 nanometers to realize the resistance. In an example explained below, the first and second resistive layers 22 and 24 have a role of the current limiting resistance element R shown in FIG. 1 and the sum of the resistances of the first and second resistive layers 22 and 24 is 1 kilo-ohm to 1 mega-ohm.

The cap film 25 is a film formed of a conductive material introduced in terms of a process to connect the memory cell MC and the second wire 31 in the upper layer. The cap film 25 includes, for example, a tungsten film.

Figure 3:
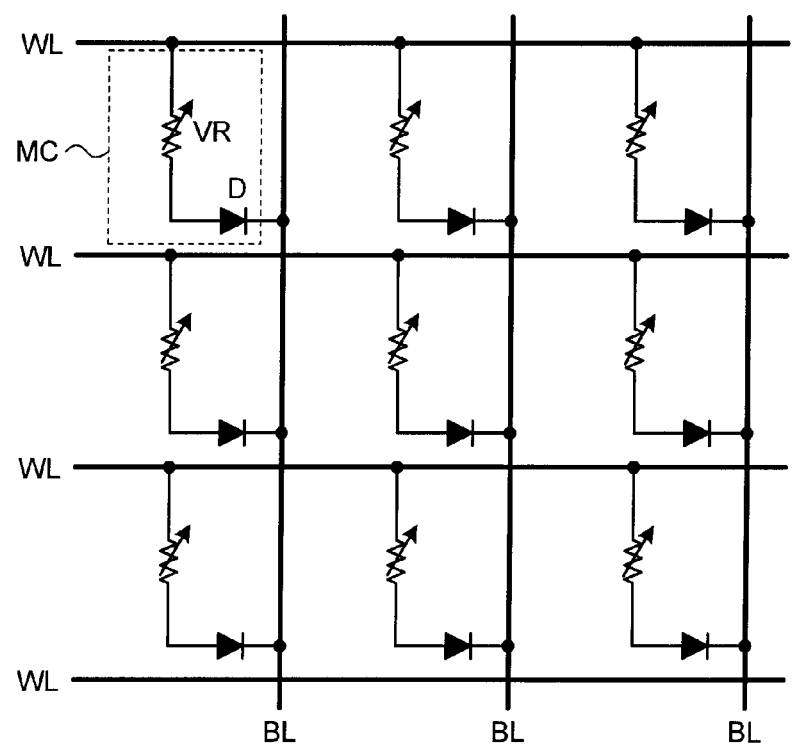
FIG. 3 is an equivalent circuit diagram of an example of a memory cell array configuration of a general resistive random access memory.

An advantage of providing the first and second resistive layers 22 and 24 is explained below in comparison with the structure of the general resistive random access memory. A desirable range of the resistances of the first and second resistive layers 22 and 24 and a desirable material of the first and second resistive layers 22 and 24 are explained. FIG. 3 is an equivalent circuit diagram of an example of a memory cell array configuration of the general resistive random access memory. In a general variable resistance memory cell MC, unlike the configuration of this embodiment shown in FIG. 1, the current limiting resistance elements R are not connected in series to the variable resistance element VR of each of the memory cells MC. The memory cell MC has a configuration in which the variable resistance element VR and the rectifying element D are connected in series. As disclosed in Japanese Patent Application Laid-Open No. 2009-157982, in general, the electrode layers of Pt, TiN, or the like having a function of a barrier metal layer and adhesive layers for improving adhesion of upper and lower layers are formed on and under the variable resistance element VR. The electrode layers have extremely small resistance compared with the variable resistance element VR and voltage drop of the electrode layers is negligible. Therefore, the electrode layers are not shown on the circuit shown in FIG. 3.

FIGS. 4A to 4E are schematic diagrams of states of filament formation in the general resistive random access memory. In an example shown in the figures, electrode layers E formed of metal such as Pt having low resistance or a metal compound such as TiN are provided on and under the variable resistance element VR. For example, in the electrode layers E having a 20 nm square shape and thickness of 5 nanometers, when Pt having specific resistance of 10.5 micro-ohm-cm is used as a material, a sum of the resistances of the upper and lower electrode layers is about 2.6 ohms. When TiN having specific resistance of about 200 micro-ohm-cm is used as a material, a sum of the resistances of the electrode layers is about 50 ohms. The electrode layers E have extremely small resistance compared with the first and second resistive layers 22 and 24 used in this embodiment that are formed such that the resistance of one of the resistive layers or a sum of the resistances of both the resistive layers is equal to or larger than 1 kilo-ohm and equal to or smaller than 1 mega-ohm.

Figure 4A:
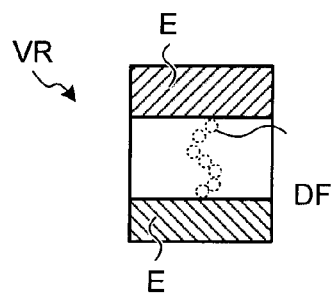
FIGS. 4A to 4E are schematic diagrams of states of filament formation in the general resistive random access memory.

FIG. 4A is a schematic diagram of a state immediately after the formation of the general variable resistance element VR. In a state immediately after the formation of the variable resistance element VR formed of a metal oxide, in general, a defect section DF such as an oxygen deficiency is present in the variable resistance element VR.

Figure 4B:
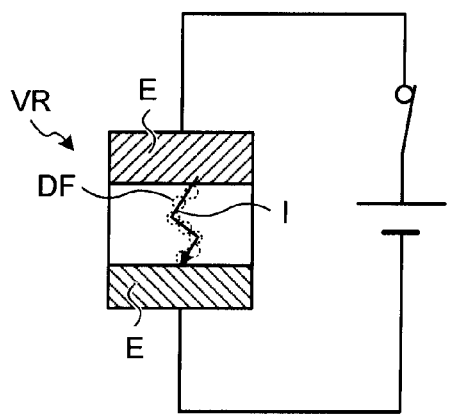
Figure 4C:
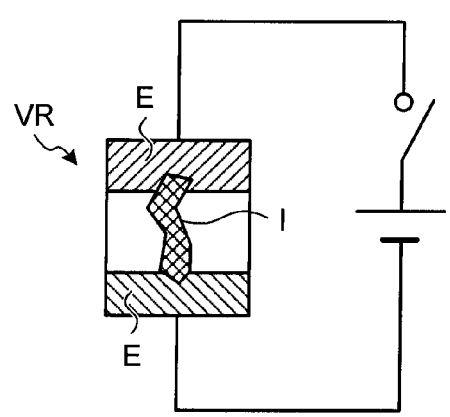

In FIGS. 4B to 4E, a state in which voltage is applied between the upper and lower electrode layers E of the variable resistance element VR shown in FIG. 4A to feed electric current I and perform forming processing is shown. In a structure in which the electrode layers E having low resistance are arranged on and under the variable resistance element VR, when voltage is applied to the variable resistance element VR to feed electric current during the forming, the electric current I starts to concentratedly flow to the defect section DF such as an oxygen deficiency (FIG. 4B). A structure change due to Joule heat generation occurs and the resistance falls (FIG. 4C). The section where the resistance falls is referred to as filament. When the variable resistance element VR is used as a resistive random access memory, there is an appropriate range of the size of the filament (a value of filament resistance). It is desirable to perform the forming such that the filament is in the range.

Figure 4D:
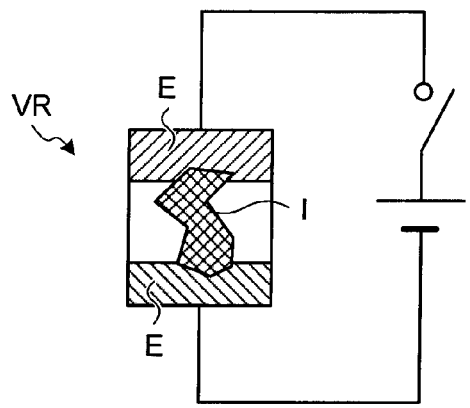
Figure 4E:
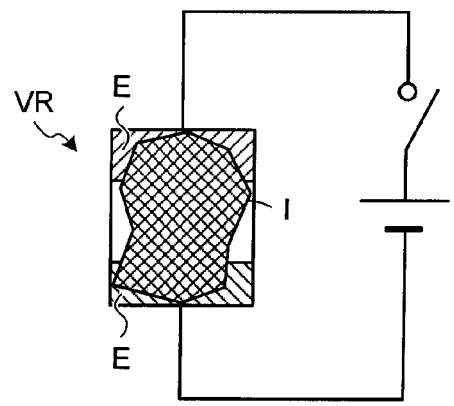

However, as shown in FIGS. 4C and 4D, when the concentrated current value is not controlled, in some case, fluctuation occurs, for example, in the size of the filament. When the fluctuation occurs in the size of the filament, fluctuation in resistance increases, and voltage and electric current during set and/or reset fluctuate. As a result, for example, the voltage during the set and the voltage during the reset are close to each other and a read voltage threshold cannot be set. In some case, as shown in FIG. 4E, because large current flows, the variable resistance element VR is broken.

To cope with such a problem, it is examined to insert an external resistor during the forming and limit electric current flowing to the variable resistance element VR. FIGS. 5A to 7B are schematic diagrams of a state in which the external resistor is inserted into a resistive random access memory and the forming processing is performed. In the resistive random access memory, as shown in FIGS. 1 and 2, to arrange the variable resistance elements VR at high density, a large number of single memory cells MC having the variable resistance elements VR and the rectifying elements D in the bit lines BL and the word lines WL sufficiently long with respect to the dimension of the memory cells MC are connected. Therefore, parasitic capacitances formed between adjacent wires are present at both ends of the variable resistance element VR. Specifically, bit line parasitic capacitance $C_{BL}$ is present on the bit line BL side and word line parasitic capacitance $C_{WL}$ is present on the word line WL side.

Figure 5A:
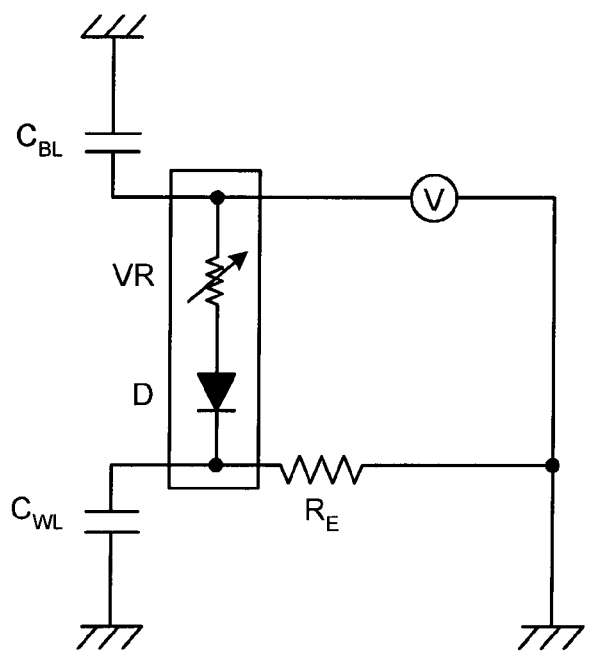
FIGS. 5A to 7B are schematic diagrams of states in which an external resistor is inserted into a resistive random access memory and forming processing is performed.
Figure 5B:
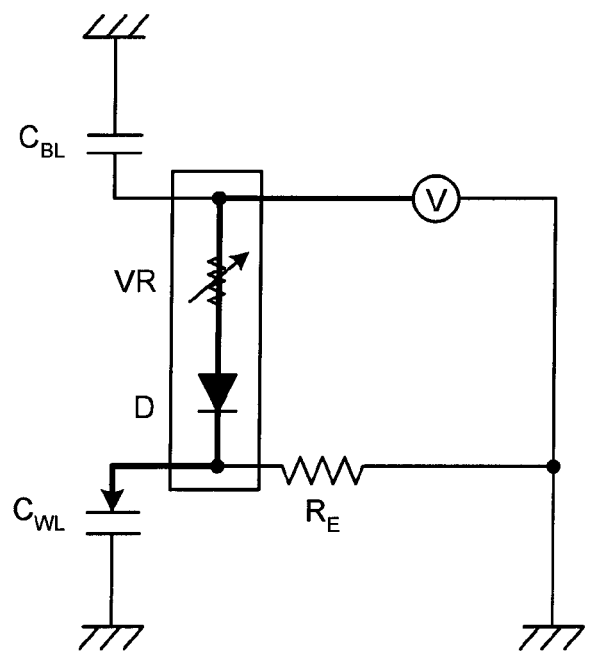

In FIG. 5A, to perform the forming processing, an external resistor $R_E$ is inserted on a downstream side in a direction in which electric current flows. When voltage is applied during the forming in such a configuration, as shown in FIG. 5B, electric current at an instance when the resistance of the variable resistance element VR falls (at an instance when a filament is formed) flows into the word line parasitic capacitance $C_{WL}$. In other words, because the electric current does not flow into the inserted external resistor $R_E$, a current value cannot be limited by the external resistor $R_E$.

Figure 6A:
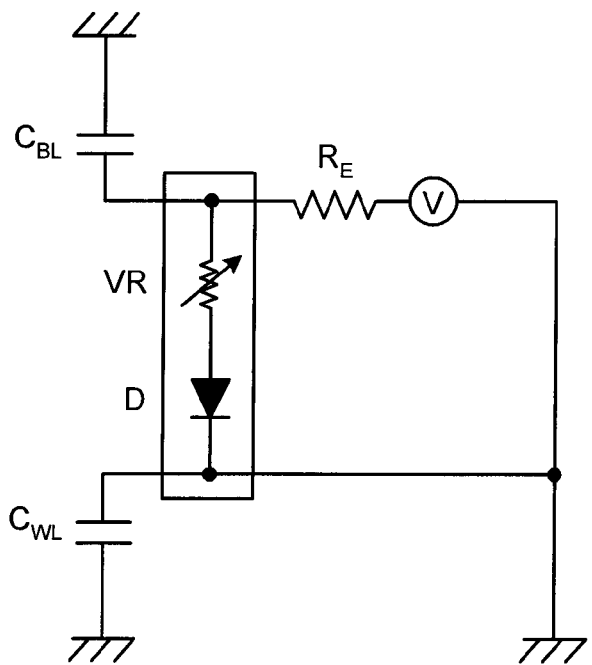
Figure 6B:
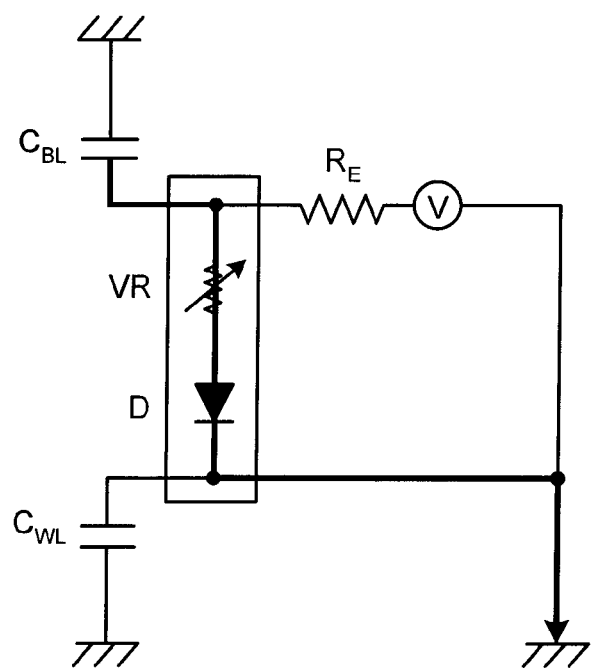

In FIG. 6A, to perform the forming processing, the external resistor $R_E$ is inserted on an upstream side in the direction in which electric current flows. When voltage is applied during the forming in such a configuration, charges are accumulated in the bit line parasitic capacitance $C_{BL}$ in a state in which the resistance of the variable resistance element VR is high. As shown in FIG. 6B, at an instance when the resistance of the variable resistance element VR falls, the charges accumulated in the bit line parasitic capacitance $C_{BL}$ flow into the earth. As a result, as in the case explained above, the electric current does not flow into the external resistor $R_E$. Therefore, a current value cannot be limited by the external resistor $R_E$.

Figure 7A:
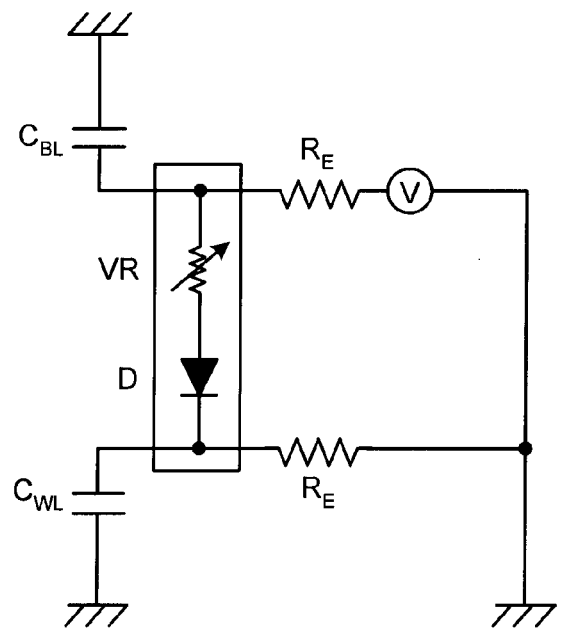
Figure 7B:
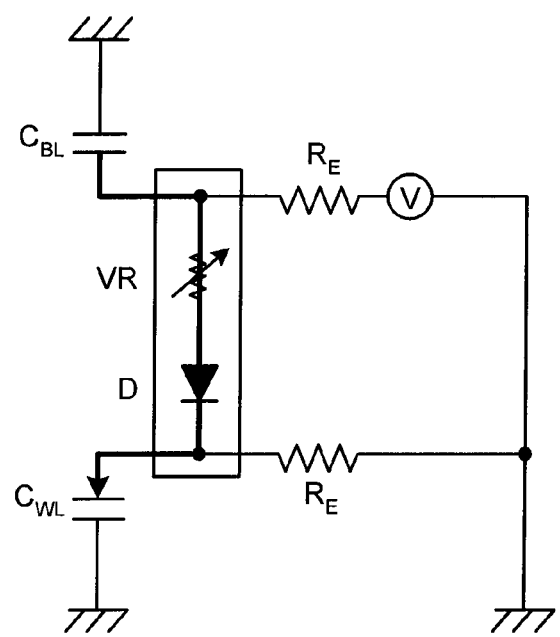

In FIG. 7A, to perform the forming processing, the external resistors $R_E$ are inserted on both the down stream side and the upstream side in the direction in which electric current flows. When voltage is applied during the forming in such a configuration, charges are accumulated in the bit line parasitic capacitance $C_{BL}$ in a state in which the resistance of the variable resistance element VR is high. As shown in FIG. 7B, at an instance when the resistance of the variable resistance element VR falls, the charges accumulated in the bit line parasitic capacitance $C_{BL}$ flow into the word line parasitic capacitance $C_{WL}$. As a result, as in the case explained above, the electric current does not flow to the inserted external resistors $R_E$ on the upstream side and the downstream side. Therefore, a current value cannot be limited by the external resistors $R_E$ inserted on the downstream side and the upstream side. As explained above, with the method of inserting the external resistor $R_E$ in the resistive random access memory, uncontrollable current flows to each of the variable resistance elements VR because of the presence of the parasitic capacitances. Therefore, it is difficult to solve the problems explained above.

On the other hand, in this embodiment, as shown in FIG. 1, the current limiting resistance elements R are arranged in series to the variable resistance element VR in each of the memory cells MC. Therefore, it is possible to control electric current flowing to each of the variable resistance elements VR during the forming or the like. In other words, even if the resistance of the variable resistance element VR suddenly changes, it is possible to substantially uniformly control and limit flowing electric current with the resistance of the current limiting resistance elements R connected in series to the variable resistance element VR. As a result, the fluctuation in the filament size in each of the memory cells MC is suppressed and the breakage of the variable resistance element VR is also suppressed.

A desirable range of resistances of the first and second resistive layers 22 and 24 is explained below. FIG. 8 is a schematic graph of a relation between the resistance of a variable resistance layer and the resistance of electrode layers. In the figure, the abscissa indicates a sum (ohm) of the resistances of the electrode layers (the first and second resistive layers 22 and 24) provided on and under the variable resistance layer 23. The ordinate indicates filament resistance (ohm) of the variable resistance layer 23.

When transistor driving voltage, diode allowable current, and the like are taken into account, it is desirable that resistance (filament resistance) in a low resistance state of the variable resistance layer 23 is in a range of 10 kilo-ohms to 10 mega-ohms. When FIG. 8 is referred to, to set the filament resistance in the range of 10 kilo-ohms to 10 mega-ohms, it is desirable to set a sum of the resistances of the upper and lower electrodes (the first and second resistive layers 22 and 24) in a range of 1 kilo-ohm to 1 mega-ohm. Further, it is desirable set the sum of the resistances of the upper and lower electrode layers to resistance equal to or smaller than 1/10 of the desired filament resistance.

As explained with reference to FIGS. 5A and 5B, when the forming processing is performed in the variable resistance layer in the initial state with high resistance, electric current is concentrated in a predetermined place to which electric current tends to flow where an oxygen deficiency or the like is present. A structure change is caused by Joule heat of the electric current, then a filament is formed, and the resistance of the variable resistance layer 23 falls. Therefore, when the resistances of the electrode layers (the first and second resistive layers 22 and 24) are equal to or higher than the resistance of the variable resistance layer 23, electric current in the electrode layers is dispersed and cannot be concentrated in one place of the variable resistance layer 23. Therefore, from such a viewpoint, it is desirable that the resistances of the electrode layers (the first and second resistive layers 22 and 24) are lower than the resistance of the variable resistance layer 23. In particular, when the electrode layers (the first and second resistive layers 22 and 24) having the resistance equal to or smaller than the resistance of the formed filament are formed, it is possible to concentrate electric current in a filament forming place of the variable resistance layer 23. Further, it is possible to suppress a voltage drop that occurs in the electrode layers (the first and second resistive layers 22 and 24) to 10% or less. Therefore, the influence on device working voltage is within an allowable range.

Further, as shown in FIG. 8, when the sum of the resistances of the upper and lower electrode layers (the first and second resistive layers 22 and 24) is set smaller than 1 kilo-ohm, the electric current flowing to the variable resistance layer 23 cannot be limited and excessively increases. Consequently, a Joule heat value increases. As shown in FIGS. 4D and 4E, the size of the formed filament is extremely large. As a result, the filament resistance is too small to be applied to a device. The variable resistance layer 23 and the rectifying layer 21 are broken during the forming.

On the other hand, when the sum of the resistances of the upper and lower electrode layers (the first and second resistive layers 22 and 24) is set larger than 1 mega-ohm, the electric current flowing to the variable resistance layer 23 is too small, the Jour heat value is also small, and the size of the formed filament is extremely small. As a result, the filament resistance is too large to be applied to a device. The forming itself cannot be performed. Therefore, it is desirable that the sum of the resistances of the first and second resistive layers 22 and 24 is 1 kilo-ohm to 1 mega-ohm and is equal to or smaller than $1/10$ of the filament resistance of the variable resistance layer 23 before the reset processing.

As explained above, when the first and second resistive layers 22 and 24 are provided in series in the variable resistance layer 23 in the memory cell MC, a voltage drop occurs in the section of the first and second resistive layers 22 and 24. However, it is possible to set voltage applied to the variable resistance layer 23 within an allowable voltage range by adjusting the thickness of the variable resistance layer 23 and setting the resistance of the formed filament high compared with the sum of the resistances of the first and second resistive layers 22 and 24.

In the above explanation, the sum of the resistances of the first and second resistive layers 22 and 24 is 1 kilo-ohm to 1 mega-ohm. However, the resistance of one of the first and second resistive layers 22 and 24 can be 1 kilo-ohm to 1 mega-ohm and equal to or smaller than $1/10$ of a value of the filament resistance before the reset processing. For example, the first resistive layer 22 can be a resistive layer having resistance of 1 kilo-ohm to 1 mega-ohm. A low-resistance conductive layer formed of TiN or the like having resistance of about 50 ohms can be provided instead of the second resistive layer 24. In this case, the first resistive layer 22 functions as a current limiting resistance element. Instead of the second resistive layer 24, the first resistive layer 22 can be replaced with the low-resistance conductive layer, and the second resistive layer 24 can be a resistive layer having resistance of 1 kilo-ohm to 1 mega-ohm.

Figure 9A:
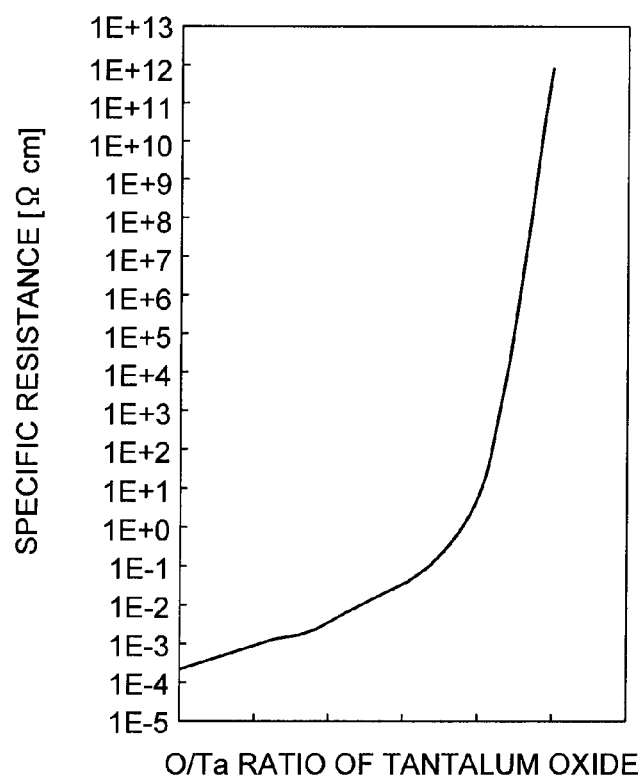
FIGS. 9A and 9B are graphs for explaining an example of oxygen composition dependency of specific resistances of metal oxides.
Figure 9B:
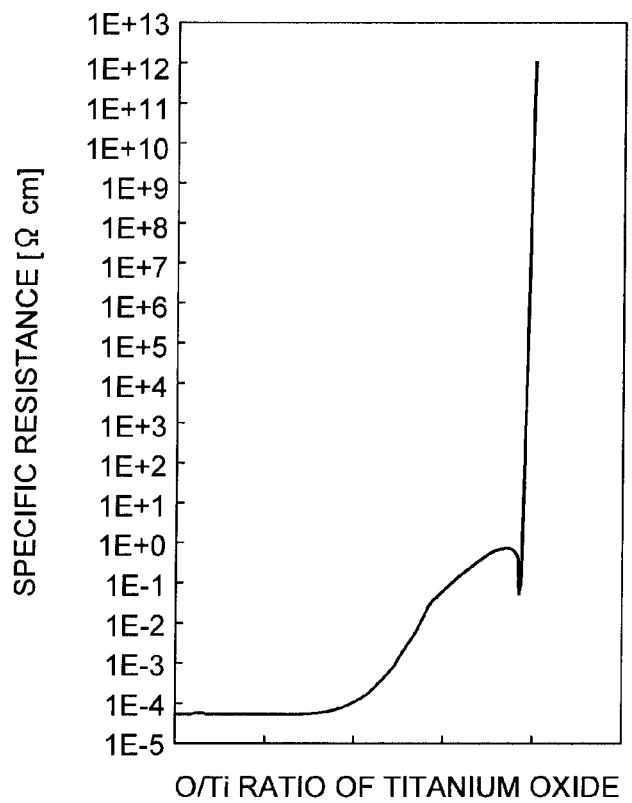

As a material forming the first and second resistive layers 22 and 24 having such resistance, a metal oxide or a metal nitride can be used. FIGS. 9A and 9B are graphs for explaining an example of oxygen composition dependency of specific resistances of metal oxides. In the figures, the abscissa indicates an atomic ratio of oxygen with respect to a metal element of a metal oxide (hereinafter, "oxygen composition ratio") (arbitrary unit). The ordinate indicates specific resistance (ohm-cm) of the metal oxide. FIG. 9A is the graph in the case of a tantalum oxide and FIG. 9B is the graph in the case of a titanium oxide. Fine behavior of the specific resistance with respect to the oxygen composition ratio is different depending on a type of the metal oxide. However, schematically, the specific resistance substantially changes depending on the oxygen composition ratio in both the cases. The oxygen composition dependency is only an example. However, in general, the specific resistance of the metal oxide substantially changes depending on the oxygen composition ratio.

Therefore, when the first and second resistive layers 22 and 24 are formed by using such a metal oxide, the oxygen composition ratio only has to be controlled such that the first and second resistive layers 22 and 24 have desired resistance. For example, when the first and second resistive layers 22 and 24 are formed in a 20 nm square and at thickness of 5 nanometers and formed of the same material, to set the sum of the resistances of the first and second resistive layers 22 and 24 to 1 kilo-ohm to 1 mega-ohm, the oxygen composition ratio of the metal oxide only has to be adjusted such that the first and second resistive layers 22 and 24 have specific resistance of 0.004 ohm-cm to 4 ohm-cm. By adjusting the oxygen composition ratio to a specific range, it is possible to limit electric current flowing to the variable resistance layer 23 to form a micro filament. The metal oxide is explained above examples, however, a metal nitride has the same tendency.

The first and second resistive layers 22 and 24 can be either the metal oxide or the metal nitride if the resistance of one of the first and second resistive layers 22 and 24 or the sum of the resistances of the first and second resistive layers 22 and 24 is 1 kilo-ohm to 1 mega-ohm and is lower than the filament resistance before the reset of the variable resistance layer 23. However, it is desirable to use the metal oxide because the variable resistance layer 23 is generally formed of the metal oxide and transition between the high resistance state and the low resistance state of the variable resistance layer 23 is considered to be caused by oxygen density (a degree of an oxygen deficiency) of the filament in the variable resistance layer 23.

In particular, the first and second resistive layers 22 and 24 are formed of a metal oxide containing an element having an absolute value of standard Gibbs free energy of oxide formation smaller than an absolute value of that of the element of the variable resistance layer 23. For example, when HfO is used for the variable resistance layer 23, a titanium oxide, a tantalum oxide, a tungsten oxide, or a molybdenum oxide only has to be used as the first and second resistive layers 22 and 24. When TiO is used for the variable resistance layer 23, a tantalum oxide, a tungsten oxide, or a molybdenum oxide only has to be used as the first and second resistive layers 22 and 24.

Metal elements satisfying such conditions are selected and the first and second resistive layers 22 and 24 formed of a metal oxide film, an oxygen composition ratio of which is adjusted such that resistance is equal to or smaller than 1 kilo-ohm and equal to or larger than 1 mega-ohm, are formed. In this case, when the filament formed in the variable resistance layer 23 is energized to cause Joule heat generation, oxygen moves from the first and second resistive layers 22 and 24 set in contact with the variable resistance layer 23 to the variable resistance layer 23 and the filament section is re-oxidized. This makes it possible to facilitate the reset operation for increasing the resistance of the variable resistance layer 23.

In this embodiment, it is schematically explained above with reference to the figures that a part of the variable resistance layer 23 in the memory cell changes to the filament. However, the entire variable resistance layer 23 of the memory cell can function as the filament without any problem through downsizing of the memory cell. It is also possible to adjust oxygen density during formation of the variable resistance layer to set resistance small without performing the forming and cause the entire variable resistance layer 23 of the memory cell to function as the filament. In this case, if the resistive layer is a metal oxide layer, oxygen can move between the resistive layer and the variable resistance layer and the resistance can be easily changed.

FIGS. 10A to 10D are schematic sectional views of an example of a procedure of a method of manufacturing the nonvolatile memory device according to the first embodiment. First, the first interlayer insulating film 10 is formed on a not-shown substrate such as an Si substrate. The first wires 11 (the bit lines BL) extending in the Y direction are formed in the first interlayer insulating film 10 by a method such as a damascene method. An element such as a complementary metal-oxide semiconductor (CMOS) transistor is formed on a substrate in a lower layer of the first interlayer insulating film 10.

Figure 10A:
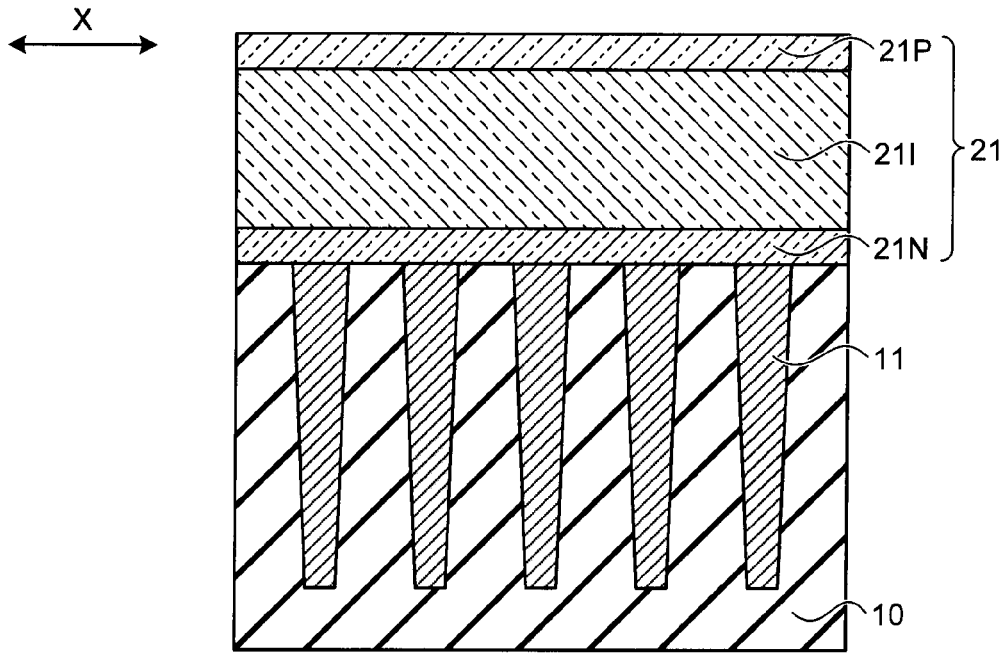
FIGS. 10A to 10D are schematic sectional views of an example of a procedure of a method of manufacturing the nonvolatile memory device according to the first embodiment.

Subsequently, the N-type polysilicon film 21N having thickness of about 20 nanometers, the I-type polysilicon film 21I having thickness of about 110 nanometers, and the P-type polysilicon film 21P having thickness of about 20 nanometers are stacked in order on the first interlayer insulating film 10, in which the first wires 11 are formed, by a film forming method such as the chemical vapor deposition (CVD) method to form the rectifying layer 21 (FIG. 10A). The N-type polysilicon film 21N is obtained by depositing a silicon film while introducing an N-type impurity such as phosphorus (P). The I-type polysilicon film 21I is obtained by depositing a silicon film in an environment in which an impurity is not introduced. The P-type polysilicon film 21P is obtained by depositing a silicon film while introducing a P-type impurity such as a boron (B).

Figure 10B:
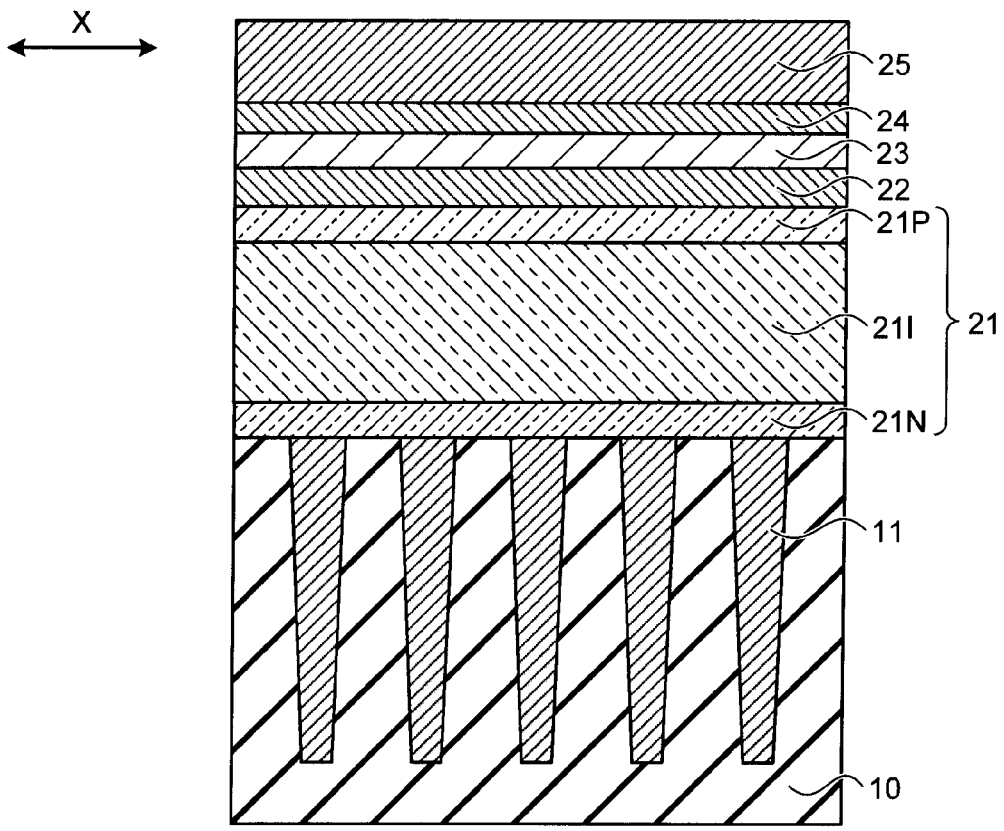

Subsequently, the first resistive layer 22 formed of a tantalum oxide film having thickness of 5 nanometers is formed by a method such as the sputtering method or the CVD method. The variable resistance layer 23 formed of, for example, an HfO film having thickness of about 5 nanometers is formed on the first resistive layer 22 by a method such as the sputtering method or the CVD method. Further, the second resistance film 24 having thickness of 5 nanometers is formed on the variable resistance layer 23 by a film forming method such as the sputtering method or the CVD method. During the formation of the first and second resistive layers 22 and 24, for example, when a shape in a direction parallel to a substrate surface of the memory cell MC after the formation is a 20 nm square, an oxygen composition ratio of the tantalum oxide film is adjusted such that the first and second resistive layers 22 and 24 have specific resistance of 0.004 ohm-cm to 4 ohm-cm. Thereafter, the cap film 25 is formed on the second resistive layer 24 by a film forming method such as the sputtering method (FIG. 10B). As the cap film 25, a W film is used.

Figure 10C:
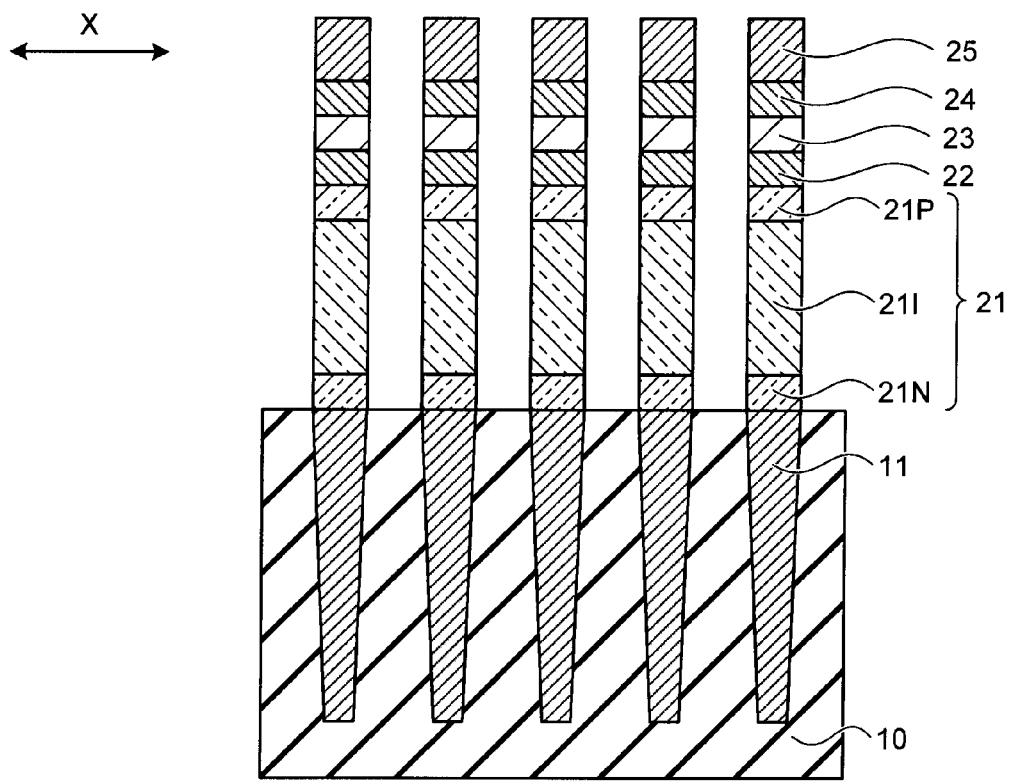

Thereafter, resist is applied over the cap film 25 and patterned into a desired pattern by the lithography technique to form a mask. The cap film 25, the second resistive layer 24, the variable resistance layer 23, the first resistive layer 22, and the rectifying layer 21 are processed by anisotropic etching such as the reactive ion etching (RIE) method to form a memory cell array pattern in which columnar memory cell patterns are two-dimensionally arranged (FIG. 10C). Each of the columnar memory cell patterns has a structure in which the rectifying layer 21, the first resistive layer 22, the variable resistance layer 23, the second resistive layer 24, and the cap film 25 are stacked in order on the first wire 11.

Figure 10D:
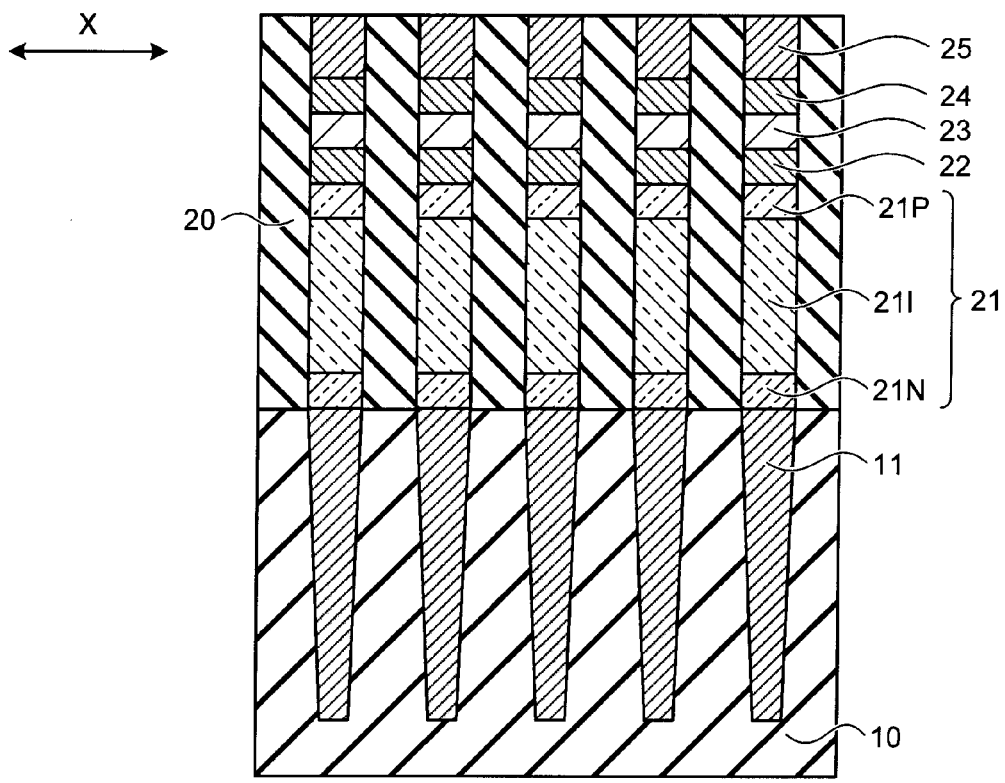

Thereafter, the second interlayer insulating film 20 is deposited to fill spaces among the memory cell patterns formed in a columnar shape and to be higher than the upper surface of the cap film 25. A high density plasma-undoped silicate glasses (HDP-USG) film formed by, for example, the plasma CVD method is deposited as the second interlayer insulating film 20. The upper surface of the second interlayer insulating film 20 is planarized by a method such as chemical mechanical polishing (CMP) method until the upper surface of the cap film 25 is exposed (FIG. 10D). When the planarization is performed without forming the cap film 25, it is likely that the second resistance film 24 and the variable resistance layer 23 are subjected to CMP processing according to retraction of the upper surface of the second interlayer insulating film 20. The CMP processing of the second resistive layer 24 and the variable resistance layer 23 is undesirable because characteristics thereof are likely to be changed. Therefore, the second resistive layer 24 is prevented from being subjected to the CMP processing and deterioration in the characteristics is prevented by forming the cap film 25 on the second resistive layer 24.

Subsequently, a not-shown third interlayer insulating film is formed on the cap film 25 and the second interlayer insulating film 20. After the upper surface of the third interlayer insulating film is planarized, a resist material is applied over the third interlayer insulating film. A mask is formed by the lithography technique to have an opening shape corresponding to the second wire 31 (the word line WL) on a forming position of a memory cell pattern. Thereafter, the third interlayer insulating film is etched by the RIE method or the like using the mask until the cap film 25 is exposed to form a groove for forming a second wire. A metal material of W or the like is filled in the groove to form the second wire 31. Thereafter, the steps explained above can be repeated a necessary number of times to form multiple layers of a structure in which the memory cell MC is held between upper and lower wires orthogonal to each other.

A voltage pulse is applied to the variable resistance layer 23 to perform the forming processing for forming a filament having desired resistance in the variable resistance layer 23. Consequently, the nonvolatile memory device shown in FIG. 2 is obtained.

In this way, the electrode layers provided on and under the variable resistance layer 23 in the memory cell MC in the past are replaced with the first and second resistive layers 22 and 24 having increased resistance. The first and second resistive layers 22 and 24 are processed at the steps same as those in the past. Consequently, the structure of the memory cell according to the first embodiment can be obtained. In other words, new films to be the first and second resistive layers 22 and 24 do not need to be formed in addition to the structure of the memory cell MC in the past. Therefore, it is possible to manufacture the memory cell MC without increasing steps compared with those in the past and increasing cell processing steps such as RIE.

In the above explanation, the rectifying layer 21 and the variable resistance layer 23 are stacked in this order on the first wire 11. However, the variable resistance layer 23 and the rectifying layer 21 can be stacked in this order on the first wire 11. Further, in the explanation, the semiconductor layer of the PIN junction structure is used as the rectifying layer. However, a semiconductor layer of a PN junction structure can be used or Schottky junction can be used.

Furthermore, in the explanation, as an example, an oxygen amount is adjusted such that the resistance of the resistive layer formed of the metal oxide is equal to or larger than 1 kilo-ohm and equal to or smaller than 1 mega-ohm. However, an impurity can be added to the resistive layer formed of the metal oxide to adjust the resistance of the resistive layer to desired resistance. For example, transition metal such as Nb, Ta, Al, Si, Hf, W, or Mo, which is not an element of the metal oxide, only has to be introduced into a metal oxide TiOx, SiOx, AlOx, TaOx, NbOx, HfOx, WOx, or MoOx having high insulation properties as an impurity to control the resistance. In particular, a TiO2 film with Nb introduced as an impurity can substantially adjust the resistance according to an amount of the impurity to be introduced. Various oxide films and impurities only have to be used in combination according to a resistance region desired to be adjusted.

As a method of manufacturing the nonvolatile memory device, besides the method explained above, two methods explained below can be used. One method is a method of manufacturing the nonvolatile memory device for, in forming a memory cell held between a first wire and a second wire, first, etching layers of the memory cell in a line shape extending in a direction same as the direction of the first wire and, subsequently, etching the layers of the memory cell in a line shape extending in a direction same as the direction of second wire to form a memory cell of a columnar structure in a crossing position of the first and second wires. The other method is a method of manufacturing the nonvolatile memory device for forming a plurality of nonvolatile storage cells to be superimposed one on top of another. This embodiment can also be applied to these manufacturing methods.

In the above explanation, the oxygen composition ratio of the first and second resistive layers 22 and 24 is adjusted such that the sum of the resistances of the first and second resistive layers 22 and 24 formed on and under the variable resistance layer 23 is equal to or larger than 1 kilo-ohm and equal to or smaller than 1 mega-ohm. However, when only one of the first and second resistive layers 22 and 24 has resistance equal to or larger than 1 kilo-ohm and equal to or smaller than 1 mega-ohm, the other of the first and second resistive layers 22 and 24 only has to be formed of a conductive layer having extremely small resistance compared with the resistive layers such as an electrode layer of TiN also having functions of a barrier metal layer and an adhesive layer.

According to the first embodiment, in the memory cell MC, the current limiting resistance element (any one of the first resistive layer 22 and the second resistive layer 24 or both) is formed in series to the variable resistance layer 23 and the resistance of the current limiting resistance element is set to 1 kilo-ohm to 1 mega-ohm. Therefore, even if the resistance of the variable resistance layer 23 suddenly changes during the forming or the like, it is possible to substantially uniformly control and limit electric current flowing to the variable resistance layer 23. As a result, there is an effect that fluctuation in the filament size in the memory cells MC can be suppressed, breakage of the variable resistance layer 23 can be suppressed, and fluctuation in switch characteristics due to breakage of elements and fluctuation in the resistance and the size of the filament can be suppressed.

There is an effect that it is possible to prevent breakage of a driving circuit element and a protective circuit element that is caused because the resistance of the variable resistance layer 23 set by the set processing is too low and large reset current flows during the reset.

Further, because the fluctuation in the switch characteristics can be suppressed, voltage and a current value during the set and during the reset do not substantially fluctuate. Therefore, because a difference between set voltage and reset voltage does not decrease, a deficiency that a read voltage threshold cannot set does not occur.

The metal oxide containing an element having an absolute value of standard Gibbs free energy of oxide formation smaller than an absolute value of that of the element of the variable resistance layer 23 is used for any one of the first resistive layer 22 and the second resistive layer 24 or both formed in contact with the variable resistance layer 23. Therefore, when the filament formed in the variable resistance layer 23 is energized to cause Joule heat generation, the filament section is efficiently re-oxidized by oxygen moving from the first and second resistive layers 22 and 24 set in contact with the variable resistance layer 23. This makes it possible to facilitate the reset operation for increasing the resistance of the variable resistance layer 23.

Further, the resistances of the first and second resistive layers 22 and 24 are set to a value equal to or smaller than 1/10 of the filament resistance of the variable resistance layer 23 before the reset processing. Consequently, there is an effect that it is possible to concentrate electric current flowing during the forming in the filament section in the variable resistance layer 23 and reduce a voltage drop in the first and second resistive layers 22 and 24 to 10% or less that hardly affects device working voltage.

When the electrode layers are formed of a material such as Pt having specific resistance of 10.5 micro-ohm-cm or TiN having specific resistance of about 200 micro-ohm-cm to be set in contact with the upper and lower surfaces of the variable resistance layer 23, the resistance of the electrode layers is sufficiently small compared with the resistance of the current limiting resistance element of this embodiment as explained above. Therefore, the effect explained above cannot be obtained.

The resistive random access memory in the past can be manufactured by replacing the electrode layers provided on and under the variable resistance layer 23 with the first and second resistive layers 22 and 24 having the resistance explained above. Therefore, there is also an effect that a new step is not added to the manufacturing steps for the resistive random access memory in the past and manufacturing cost can be reduced.

Figure 11:
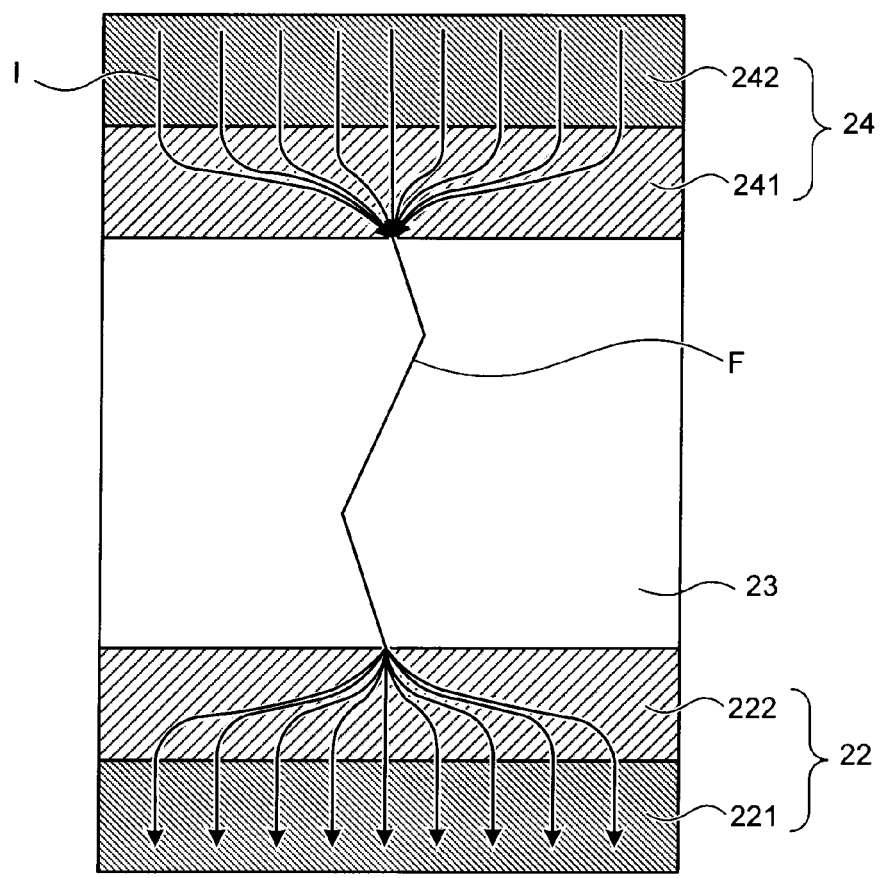
FIG. 11 is a schematic sectional view of a configuration example of a resistive random access memory according to a second embodiment.

FIG. 11 is a schematic sectional view of a configuration example of a resistive random access memory according to a second embodiment. In the resistive random access memory according to the second embodiment, the first and second resistive layers 22 and 24 include a plurality of layers having resistances different from one another such that a section of the first and second resistive layers 22 and 24 set in contact with the variable resistance layer 23 has resistance lower than the resistance of other sections. The first resistive layer 22 includes a high-resistance layer 221 having high resistance and a low-resistance layer 222 having low resistance. The low-resistance layer 222 is set in contact with the variable resistance layer 23. The second resistive layer 24 includes a low-resistance layer 241 having low resistance and a high-resistance layer 242 having high resistance. The low-resistance layer 241 is set in contact with the variable resistance layer 23. As the high-resistance layers 221 and 242, for example, a metal oxide film or a metal nitride film having resistance same as that of the resistive layers explained in the first embodiment can be used. The low-resistance layers 222 and 241 only have to be films formed of a material having resistance lower than that of the high-resistance layers 221 and 242. For example, a conductive material having low resistance like metal such as Ti or a metal compound such as TiN used in the past can be used or the metal oxide film or the metal nitride film used in the high-resistance layers 221 and 242 with the resistance reduced by changing a composition and dopant density thereof can be used.

The resistive layer can include three or more conductive layers having different resistances rather than the two resistive layers. Alternatively, the resistive layer can include one conductive layer having a structure in which, for example, an oxygen composition ratio of a metal oxide film is changed in an inclining manner such that resistance gradually increases from a side set in contact with the variable resistance layer 23.

By adopting such a configuration, as explained in the first embodiment, the high-resistance layers 221 and 242 have a function of limiting electric current I caused by a sudden fall in the resistance of the variable resistance layer 23 during the forming and during the set. The low-resistance layers 222 and 241 have a function of concentrating the electric current I toward a region where a filament F is present.

According to the second embodiment, the low-resistance layers 222 and 241 having the resistance lower than that of the high-resistance layers 221 and 242 are provided between the variable resistance layer 23 and the high-resistance layers 221 and 242. Therefore, in addition to the effect of the first embodiment, an effect can be obtained that it is possible to easily concentrate electric current toward the filament F in the variable resistance layer 23.

In the first embodiment, the first and second resistive layers or one of the first and second resistive layers is provided to be set in contact with the upper and lower surfaces of the variable resistance layers. The first and second resistive layers that limit electric current only have to be provided in series in the variable resistance layer and do not always have to be formed in contact with the variable resistance layer.

Figure 12:
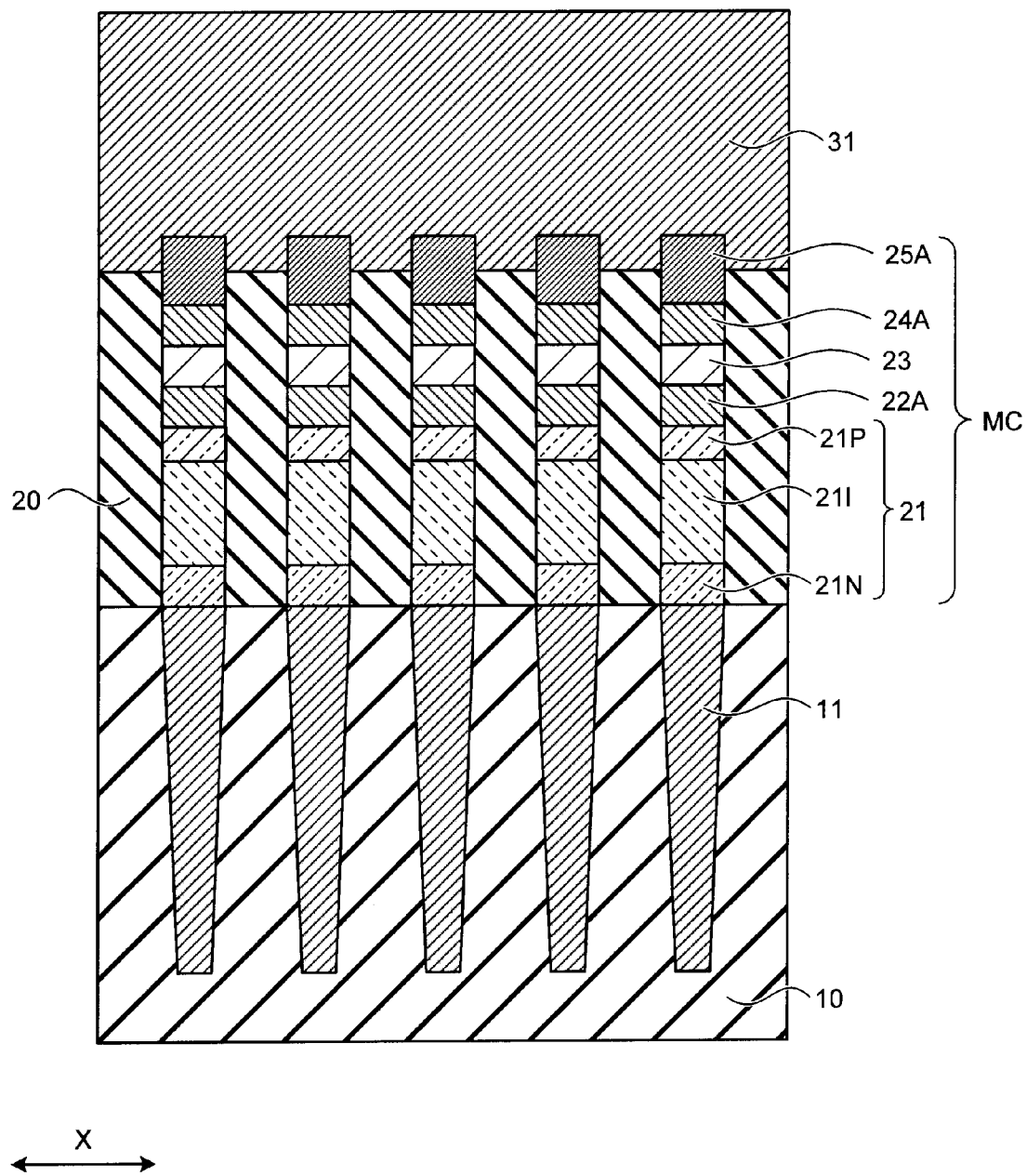
FIG. 12 is a schematic sectional view of a configuration example of a resistive random access memory according to a third embodiment.

FIG. 12 is a schematic sectional view of a configuration example of a resistive random access memory according to a third embodiment. The rectifying layer 21 including a stacked film of the N-type polysilicon film 21N, the I-type polysilicon film 21I, and the P-type polysilicon film 21P, a first conductive layer 22A also functioning as a barrier metal layer and an adhesive layer, the variable resistance layer 23, a second conductive layer 24A also functioning as a barrier metal layer and an adhesive layer, and a cap film 25A are formed in order on the first wire 11. The second wire 31 is formed on the cap film 25A. As in the past, the first and second conductive layers 22A and 24A are formed of a material having low resistance such as TiN. The cap film 25A has resistance of 1 kilo-ohm to 1 mega-ohm and is formed of a conductive material having resistance lower than the filament resistance of the variable resistance film 23 before the reset processing. In other words, in the third embodiment, the cap film 25A has the function of the resistive layer.

In this way, any conductive layer connected in series to the variable resistance layer 23 in the memory cell MC can be used as the resistive layer. In the example explained above, the cap film 25A is used as the current limiting resistance element R. However, the resistance of any one of the conductive layers connected in series to the variable resistance layer 23 in the memory cell MC or a sum of the resistances of all the conductive layers can be set to 1 kilo-ohm to 1 mega-ohm. For example, in the case of FIG. 12, the resistance of any one of the first and second conductive layers 22A and 24A and the cap film 25A or a sum of the resistances of these layers can be set to 1 kilo-ohm to 1 mega-ohm. A method of manufacturing such a resistive random access memory is the same as the method explained in the first embodiment. Therefore, explanation of the method is omitted.

According to the third embodiment, an effect same as the effect of the first embodiment can be obtained.

As explained above, according to the embodiments, there is an effect that it is possible to prevent breakage of a nonvolatile storage element forming a nonvolatile memory device during the forming and during the set of the nonvolatile storage element and prevent breakage of a driving circuit element and a protective circuit element during the reset when resistance set during the set is too low.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A nonvolatile memory device comprising:
a first wire extending in a first direction;
a second wire formed at height different from height of the first wire and extending in a second direction; and
a nonvolatile memory cell arranged to be held between the first wire and the second wire in a position where the first wire and the second wire cross, wherein
the nonvolatile memory cell includes a nonvolatile storage layer and a current limiting resistance layer connected in series to the nonvolatile storage layer and having resistance of 1 kilo-ohm to 1 mega-ohm,
the nonvolatile memory cell has a structure in which the nonvolatile storage layer is held between a pair of conductive layers, and
one of the pair of conductive layers or both the pair of conductive layers function as the current limiting resistance layer.

2. The nonvolatile memory device according to claim 1, wherein
the nonvolatile storage layer is formed of a metal oxide, and
one or both of the conductive layers functioning as the current limiting resistance layer are formed of an oxide of a metal element having an absolute value of standard Gibbs free energy of oxide formation smaller than an absolute value of that of an element of the nonvolatile storage layer and formed in contact with the nonvolatile storage layer.

3. The nonvolatile memory device according to claim 1, wherein
the nonvolatile storage layer is formed of a metal oxide, and
one or both of the conductive layers functioning as the current limiting resistance layer are formed of a metal nitride and formed in contact with the nonvolatile storage layer.

4. The nonvolatile memory device according to claim 1, wherein one or both of the conductive layers functioning as the current limiting resistance layer are formed such that a section thereof set in contact with the nonvolatile storage layer has resistance lower than that of other sections.

5. The nonvolatile memory device according to claim 4, wherein
one or both of the conductive layers functioning as the current limiting resistance layer are formed by stacking a plurality of conductive material layers, and
the conductive material layers have higher resistance further away from a layer set in contact with the nonvolatile storage layer.

6. The nonvolatile memory device according to claim 4, wherein one or both of the conductive layers functioning as the current limiting resistance layer include one conductive material layer, a composition of which is changed in an inclining manner such that resistance is higher further away from a side set in contact with the nonvolatile storage layer.

7. The nonvolatile memory device according to claim 1, wherein the nonvolatile memory cell has a structure in which a stacked member including a rectifying layer and the nonvolatile storage layer, and a cap film formed between the stacked member and the second wire and formed of a conductive material are stacked, and the current limiting resistance layer is the cap film.

8. The nonvolatile memory device according to claim 1, wherein the nonvolatile memory cell has a structure in which a stacked member including a rectifying layer and the nonvolatile storage layer held between the pair of conductive layers, and a cap film formed between the stacked member and the second wire and formed of a conductive material are stacked, and at least one of the pair of conductive layers and the cap film functions as the current limiting resistance layer.

9. The nonvolatile memory device according to claim 8, wherein one or both of the conductive layers or the cap film functioning as the current limiting resistance layer are formed of a metal oxide or a metal nitride.

* * * * *